(12) United States Patent
Park et al.

(10) Patent No.: US 12,029,134 B2
(45) Date of Patent: Jul. 2, 2024

(54) SEMICONDUCTOR DEVICES HAVING OXIDATION CONTROL LAYER

(71) Applicant: SAMSUNG ELECTRONICS CO., LTD., Suwon-si (KR)

(72) Inventors: Sanghwan Park, Suwon-si (KR); Younghyun Kim, Seoul (KR); Jaehoon Kim, Seoul (KR); Heeju Shin, Seoul (KR); Sechung Oh, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 500 days.

(21) Appl. No.: 17/402,960

(22) Filed: Aug. 16, 2021

(65) Prior Publication Data

US 2022/0238795 A1  Jul. 28, 2022

(30) Foreign Application Priority Data

Jan. 28, 2021 (KR) .......... 10-2021-0012133

(51) Int. Cl.
  *H10N 50/85* (2023.01)
  *H01L 23/522* (2006.01)
  *H01L 23/528* (2006.01)
  *H10B 61/00* (2023.01)
  *H10N 50/10* (2023.01)
  *H10N 50/80* (2023.01)

(52) U.S. Cl.
  CPC ......... *H10N 50/10* (2023.02); *H01L 23/5226* (2013.01); *H01L 23/5283* (2013.01); *H10B 61/22* (2023.02); *H10N 50/80* (2023.02); *H10N 50/85* (2023.02)

(58) Field of Classification Search
  CPC ........ H10N 50/10; H10N 50/80; H10N 50/85; H01L 23/5226; H01L 23/5283; H10B 61/22

See application file for complete search history.

(56) References Cited

U.S. PATENT DOCUMENTS

| | | |
|---|---|---|
| 9,166,143 B1 | 10/2015 | Gan et al. |
| 9,947,862 B2 | 4/2018 | Watanabe et al. |
| 10,475,564 B2 | 11/2019 | Thomas et al. |
| 10,797,225 B2 | 10/2020 | Sundar et al. |
| 10,797,232 B2 | 10/2020 | Patel et al. |
| 2015/0207064 A1 | 7/2015 | Lee et al. |
| 2019/0386209 A1 | 12/2019 | Smith et al. |
| 2022/0158085 A1* | 5/2022 | Park ................ H10N 50/80 |

FOREIGN PATENT DOCUMENTS

| KR | 10-1636492 B1 | 6/2016 |
|---|---|---|
| KR | 10-2020-0002754 A | 1/2020 |

* cited by examiner

*Primary Examiner* — Allison Bernstein
*Assistant Examiner* — Margaret B Hayes
(74) *Attorney, Agent, or Firm* — Muir Patent Law, PLLC

(57) ABSTRACT

A semiconductor device including a substrate; a lower electrode on the substrate; a magnetic tunnel junction structure on the lower electrode, the magnetic tunnel junction structure including a pinned layer, a tunnel barrier layer, and a free layer which are sequentially stacked; an upper electrode on the magnetic tunnel junction structure; and an oxidation control layer between the free layer and the upper electrode, the oxidation control layer including at least one filter layer and at least one oxide layer, wherein the at least one filter layer includes MoCoFe.

20 Claims, 11 Drawing Sheets

SEMICONDUCTOR DEVICES HAVING OXIDATION CONTROL LAYER

CROSS-REFERENCE TO THE RELATED APPLICATION

Korean Patent Application No. 10-2021-0012133, filed on Jan. 28, 2021 in the Korean Intellectual Property Office, and entitled: "Semiconductor Devices Having Oxidation Control Layer," is incorporated by reference herein in its entirety.

BACKGROUND

1. Field

Embodiments relate to a semiconductor device having an oxidation control layer.

2. Description of the Related Art

In accordance with a tendency of semiconductor devices toward miniaturization, technology for high integration and/or low operating voltage of a semiconductor memory device has been considered. To this end, as a semiconductor memory device, a magnetic memory device has been proposed.

SUMMARY

The embodiments may be realized by providing a semiconductor device including a substrate; a lower electrode on the substrate; a magnetic tunnel junction structure on the lower electrode, the magnetic tunnel junction structure including a pinned layer, a tunnel barrier layer, and a free layer which are sequentially stacked; an upper electrode on the magnetic tunnel junction structure; and an oxidation control layer between the free layer and the upper electrode, the oxidation control layer including at least one filter layer and at least one oxide layer, wherein the at least one filter layer includes MoCoFe.

The embodiments may be realized by providing a semiconductor device including a substrate; a lower electrode on the substrate; a magnetic tunnel junction structure on the lower electrode, the magnetic tunnel junction structure including a free layer, a tunnel barrier layer, and a pinned layer which are sequentially stacked; an upper electrode on the magnetic tunnel junction structure; and an oxidation control layer between the free layer and the lower electrode, the oxidation control layer including a filter layer and an oxide layer, wherein the filter layer includes MoCoFe.

The embodiments may be realized by providing a semiconductor device including a substrate including a logic area including a logic element, and a memory area including a memory element disposed in the logic area in an embedded form; and transistors on the substrate, wherein the memory element includes a lower electrode, a magnetic tunnel junction structure on the lower electrode, the magnetic tunnel junction structure including a pinned layer, a free layer, and a tunnel barrier layer between the pinned layer and the free layer, an upper electrode on the magnetic tunnel junction structure, and an oxidation control layer between the free layer and the upper electrode or between the free layer and the lower electrode, the oxidation control layer including a filter layer and an oxide layer, and the filter layer includes MoCoFe.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
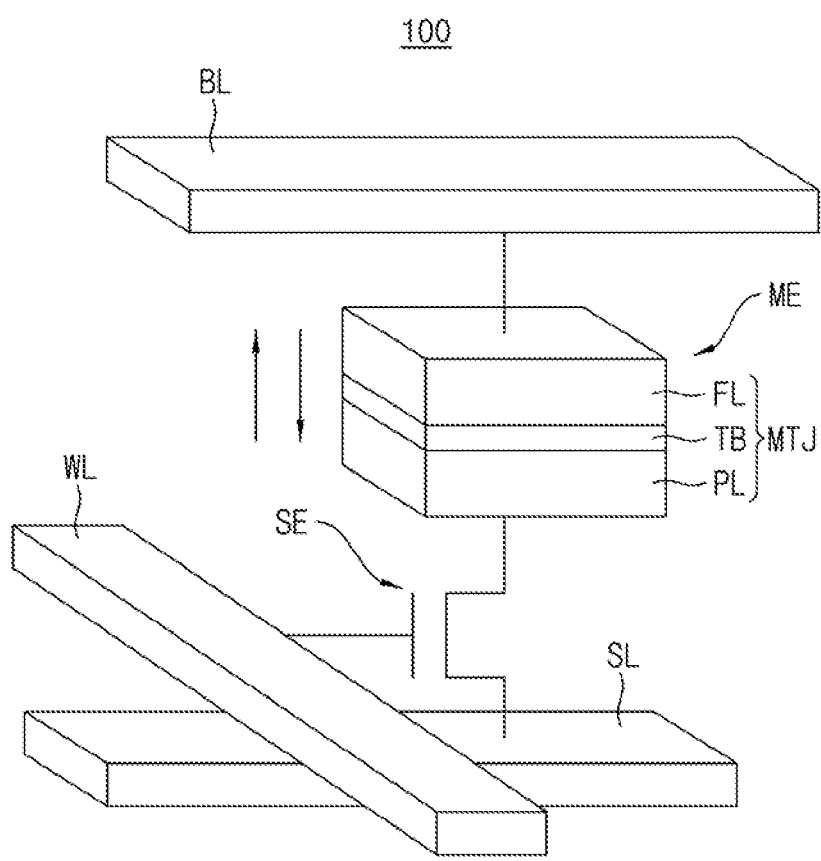
FIG. 1 is a conceptual view of a semiconductor device according to an example embodiment.

FIG. 1 is a conceptual view of a semiconductor device according to an example embodiment. The semiconductor device according to the exemplary embodiment of the disclosure may include a non-volatile memory device such as a magnetic random access memory (MRAM) or an X-point memory. In an implementation, the semiconductor device may include a spin-transfer-torque MRAM (STT-MRAM).

Referring to FIG. 1, a semiconductor device 100 may include a memory element ME, a selection element SE electrically connected to the memory element ME, a source line SL and a word line WL which are electrically connected to the selection element SE, and a bit line BL electrically connected to the memory element ME. The selection element SE may be connected between the source line SL and the memory element ME and, as such, may be controlled by the word line WL. In an implementation, the selection element SE may include a diode, a PNP bipolar transistor, an NPN bipolar transistor, an NMOS field effect transistor, or a PMOS field effect transistor. In an implementation, when the selection element SE is constituted by a bipolar transistor or a MOS field effect transistor, which is a three-terminal element, an additional wiring may be connected to the selection element SE.

The memory element ME may include a pinned layer PL, a free layer FL, and a tunnel barrier layer TB between the pinned layer PL and the free layer FL. The free layer FL, the pinned layer PL, and the tunnel barrier layer TB may constitute a magnetic tunnel junction MTJ (or a magnetic tunnel junction structure). In operation of the memory element ME, current may flow in a vertical direction across the memory element ME. The tunnel barrier layer TB may isolate the pinned layer PL and the free layer FL from each other and, as such, current may flow across the tunnel barrier layer TB in accordance with quantum tunneling. A magnetic moment of the free layer FL may be switched to be parallel or anti-parallel to a magnetic moment of the pinned layer PL in accordance with a direction of current or an intensity of a voltage. Data may be stored in accordance with a resistance difference between a parallel state and an anti-parallel state. In an implementation, low resistance (e.g., a parallel state) corresponds to a binary number of "1", and high resistance (e.g., an anti-parallel state) may correspond to a binary number of "0". In an implementation, low resistance may correspond to the binary number of "0", and high resistance may correspond to the binary number of "1".

Figure 2:
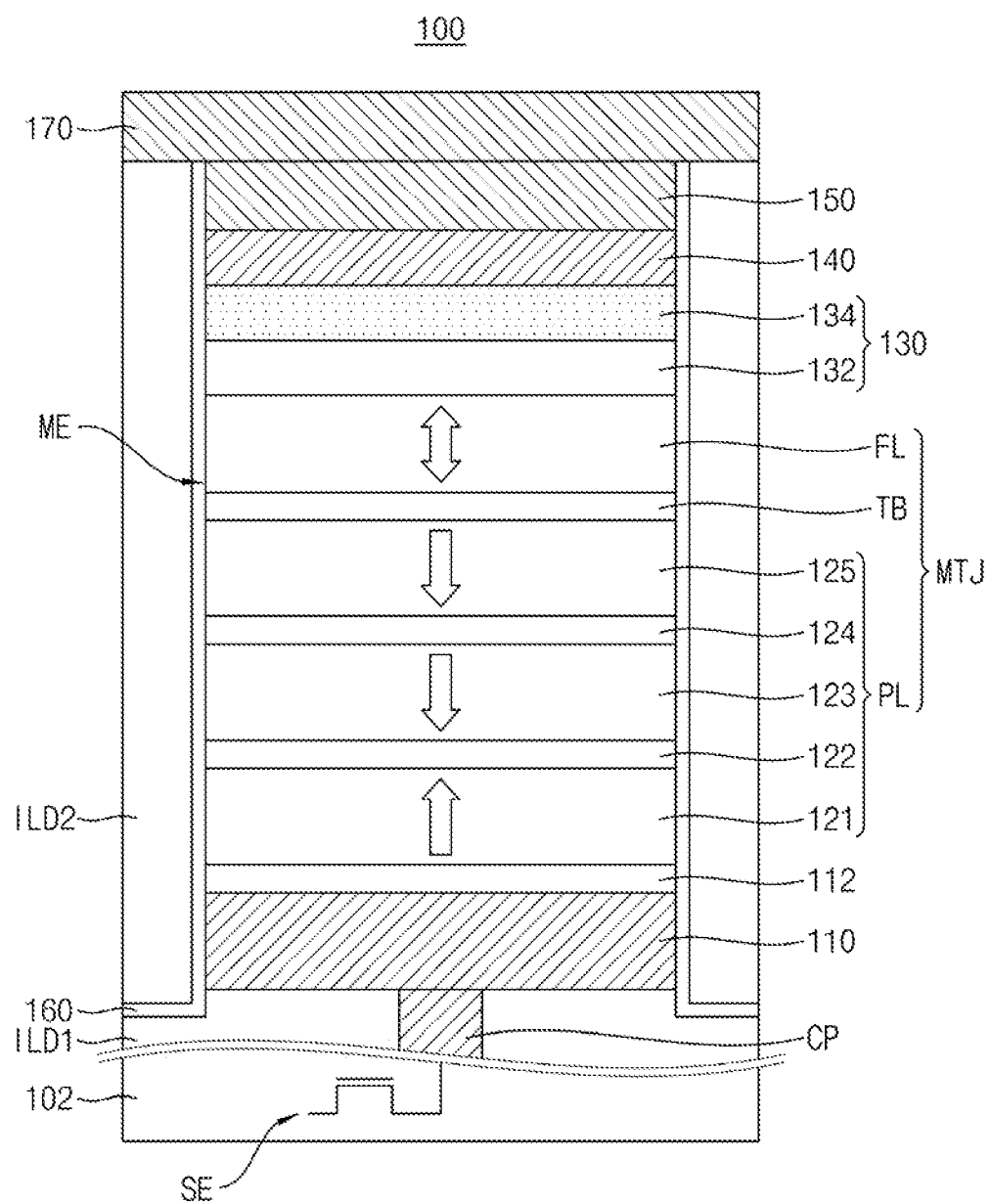
FIG. 2 is a cross-sectional view of a semiconductor device according to an example embodiment.
Figure 3:
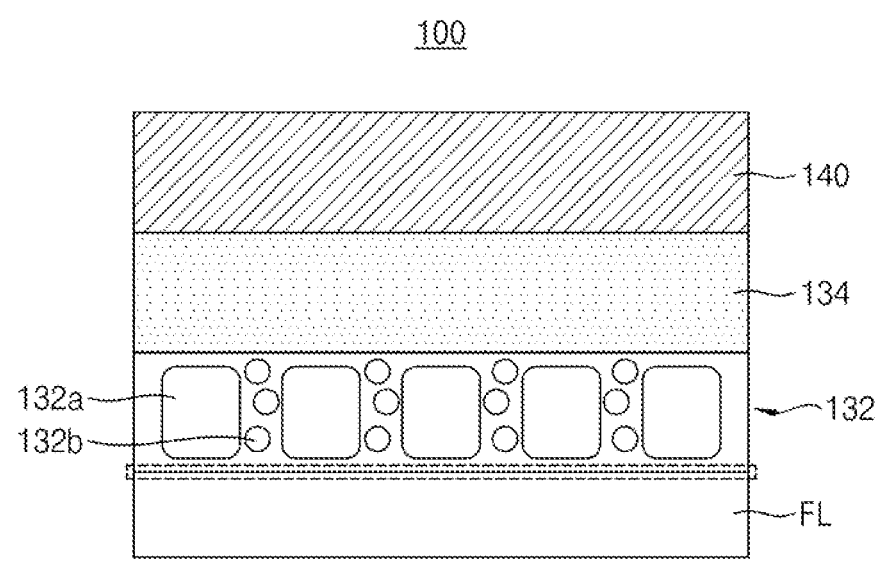
FIG. 3 is an enlarged view of the semiconductor device shown in FIG. 2.

FIG. 2 is a cross-sectional view of a semiconductor device according to an example embodiment. FIG. 3 is an enlarged view of the semiconductor device shown in FIG. 2.

Referring to FIGS. 2 and 3, a semiconductor device 100 may include a substrate 102, a contact plug CP, a lower electrode 110, a seed layer 112, a magnetic tunnel junction structure MTJ, an oxidation control layer 130, a capping layer 140, an upper electrode 150, a passivation layer 160, and an upper wiring layer 170. The lower electrode 110, the seed layer 112, the magnetic tunnel junction structure MTJ, the oxidation control layer 130, the capping layer 140, and the upper electrode 150 may constitute a memory element ME. In an implementation, the horizontal width of the memory element ME may be uniform, as illustrated in FIG. 2. In an implementation, the horizontal width of the memory element ME may increase as the memory element ME extends downwards (e.g., toward the substrate 102).

The substrate 102 may include a semiconductor material. In an implementation, the substrate 102 may be, e.g., a silicon substrate, a germanium substrate, a silicon germanium substrate or a silicon-on-insulator (SOI) substrate. In an implementation, a selection element SE may be in the substrate 102, as illustrated in the drawings. In an implementation, the selection element SE may be on the substrate 102. In an implementation, the selection element SE may include a field effect transistor.

The contact plug CP may be on the substrate 102, and may be electrically connected to the selection element SE. In an implementation, a plurality of wiring layers and contact plugs interconnecting the plurality of wiring layers may be between the substrate 102 and the contact plug CP. The contact plug CP may be electrically connected to the plurality of wiring layers.

The semiconductor device 100 may further include a lower interlayer insulating layer ILD1. The lower interlayer insulating layer ILD1 may be on the substrate 102, and may cover a side surface of the contact plug CP. A portion of an upper surface of the lower interlayer insulating layer ILD1 may be coplanar with an upper surface of the contact plug CP. The remaining portion of the upper surface of the lower interlayer insulating layer ILD1 may be at a lower level (e.g., closer to the substrate 102) than the upper surface of the contact plug CP. The lower interlayer insulating layer ILD1 may include silicon oxide, silicon nitride, silicon oxynitride, or a combination thereof. In an implementation, the lower interlayer insulating layer ILD1 may include silicon oxide.

The lower electrode 110 may contact (e.g., directly contact) the upper surface of the contact plug CP. The lower electrode 110 may have a greater horizontal width than that of the contact plug CP. The lower electrode 110 may include a conductive material. In an implementation, the lower electrode 110 may include a metal, e.g., W, Ti, Ta, or the like, or a metal nitride, e.g., WN, TiN, TaN, or the like. In an implementation, the lower electrode 110 may include, e.g., TiN. As used herein, the term "or" is not an exclusive term, e.g., "A or B" would include A, B, or A and B.

The seed layer 112 may be on the lower electrode 110. The seed layer 112 may include, e.g., Ru, Pt, Pd, or a combination thereof. In an implementation, the seed layer 112 may include, e.g., Ru.

The magnetic tunnel junction structure MTJ may be on the seed layer 112. In an implementation, the magnetic tunnel junction structure MTJ may be a perpendicular magnetic tunnel junction (pMTJ). In an implementation, the magnetization direction of magnetic layers in the magnetic tunnel junction structure MTJ may be parallel to a vertical direction. In an implementation, the magnetization direction of the magnetic layers in the magnetic tunnel junction structure MTJ may be a horizontal direction.

The magnetic tunnel junction structure MTJ may include a pinned layer PL, a free layer FL, and a tunnel barrier layer TB between the pinned layer PL and the free layer FL. The pinned layer PL may contact (e.g., directly contact) an upper surface of the seed layer 112, and may be constituted by a single layer or multiple layers. In an implementation, the pinned layer PL may include, e.g., a first magnetic layer 121, a first spacer 122, a second magnetic layer 123, a second spacer 124 and a polarization enhancement layer 125 which are sequentially stacked in this order.

The first magnetic layer 121, the first spacer 122, and the second magnetic layer 123 may be antiferromagnetic layers and may have, e.g., a synthetic antiferromagnetic (SAF) structure. The synthetic antiferromagnetic structure may be constituted by the first magnetic layer 121 and the second magnetic layer 123, which are ferromagnetic layers and the first spacer 122 which is a non-magnetic layer and is between the first magnetic layer 121 and the second magnetic layer 123. Magnetization directions of the ferromagnetic layers may be aligned in opposite directions due to antiferromagnetic coupling generated between the ferromagnetic layers, e.g., the first magnetic layer 121 and the second magnetic layer 123 and, as such, the total magnetization quantity of the synthetic antiferromagnetic structure may be minimized.

The first magnetic layer 121 and the second magnetic layer 123 may each independently include, e.g., a perpendicular magnetic material, a perpendicular magnetic material having an $L1_0$ structure, CoPt having a hexagonal close-packed lattice structure, or a perpendicular magnetic structure. The perpendicular magnetic material may include, e.g., CoFe, CoFeB, CoFeTb, CoFeGd, CoFeDy, or the like. The perpendicular magnetic material, which has an $L1_0$ structure, may include, e.g., $L1_0$-FePt, $L1_0$-FePd, $L1_0$-CoPd, $L1_0$-CoPt, or the like. The perpendicular magnetic structure may include magnetic layers and non-magnetic layers which are alternately and repeatedly stacked. In an implementation, the perpendicular magnetic structure may include, e.g., (Co/Pt)n, (CoFe/Pt)n, (CoFe/Pd)n, (Co/Pd)n, (Co/Ni)n, (CoNi/Pt)n, (CoCr/Pt)n or (CoCr/Pd)n (in which n is the number of stacking times). In an implementation, the first magnetic layer 121 and the second magnetic layer 123 may each independently include, e.g., CoFe or CoFeB.

The first spacer 122 may include a single metal, e.g., Ru, Cr, Pt, Pd, Ir, Rh, Ru, Os, Re, Au, or Cu, or an alloy thereof. In an implementation, the first spacer 122 may include, e.g., Ru.

The second spacer 124 may be on the second magnetic layer 123. The polarization enhancement layer 125 may be on the second spacer 124, e.g., in order to help enhance spin polarization of the pinned layer PL. The magnetization direction of the polarization enhancement layer 125 may be parallel to the magnetization direction of the second magnetic layer 123.

The second spacer 124 may include a ferromagnetic material. In an implementation, the second spacer 124 may include, e.g., W, Ta, or an alloy thereof. The polarization enhancement layer 125 may include a ferromagnetic material, e.g., Co, Fe, or Ni. The polarization enhancement layer 125 may have high spin polarizability and a low damping constant. In an implementation, the polarization enhancement layer 125 may further include a non-magnetic material, e.g., B, Zn, Ru, Ag, Au, Cu, C, or N. In an implementation, the polarization enhancement layer 125 may include, e.g., CoFe or CoFeB.

The tunnel barrier layer TB may be between the pinned layer PL and the free layer FL. In an implementation, the tunnel barrier layer TB may contact (e.g., directly contact) an upper surface of the polarization enhancement layer 125. The tunnel barrier layer TB may include, e.g., an oxide of Mg, Ti, Al, MgZn, or MgB. In an implementation, the tunnel barrier layer TB may include, e.g., MgO.

The free layer FL may be on the tunnel barrier layer TB. The magnetization direction of the free layer FL may be changed between two stabilized magnetization directions by an external magnetic field. In an implementation, the free layer FL may be magnetized in a vertical direction, and the magnetization direction of the free layer FL may be parallel to or opposite to the magnetization direction of the pinned layer PL. The free layer FL may include, e.g., a perpendicular magnetic material, a perpendicular magnetic material having an $L1_0$ structure, CoPt having a hexagonal close-packed lattice structure, or a perpendicular magnetic structure. In an implementation, the free layer FL may include, e.g., CoFeB.

The oxidation control layer 130 may be between the free layer FL and the capping layer 140. Further referring to FIG. 3, the oxidation control layer 130 may include, e.g., a filter layer 132, and an oxide layer 134 on the filter layer 132. The filter layer 132 may help limit an amount of oxygen diffused from the oxide layer 134 to the magnetic tunnel junction structure MTJ. In an implementation, the filter layer 132 may help prevent the magnetic tunnel junction structure MTJ from being degraded at high temperature in a back-end-of-line (BEOL) process following memory stack formation. In an implementation, the filter layer 132 may help reduce or prevent excessive oxidation of the magnetic layers of the magnetic tunnel junction structure MTJ and, as such, may help prevent an increase in resistance of the memory element ME. Interface perpendicular magnetic anisotropy (IPMA) may be formed at an interface between the free layer FL and the oxidation control layer 130 (indicated by a dashed line) in accordance with iron-oxygen coupling. In an implementation, a thickness of the oxidation control layer 130 may be 3 Å to 20 Å.

The filter layer 132 may include an alloy of a metal material having high oxygen affinity and a ferromagnetic material. In an implementation, as shown in FIG. 3, the metal material 132a of the filter layer 132 may have a grain structure. The ferromagnetic material 132b may have a smaller grain size than the metal material 132a and, as such, grains of the ferromagnetic material 132b may be disposed among grains of the metal material 132a. Oxygen may migrate along grain boundaries of the metal material 132a and, as such, the filter layer 132 may help limit diffusion of oxygen. The metal material 132a may have greater oxygen affinity than the magnetic layers of the magnetic tunnel junction structure MTJ, e.g., the free layer FL. The metal material 132a may include, e.g., Zr, Hf, Be, Mo, Al, Ta, W, Cr, Ti, Li, or a combination thereof. The ferromagnetic material 132b may include, e.g., Co, Fe, Ni, or an alloy thereof. In an implementation, the filter layer 132 may include MoCoFe.

The oxide layer 134 may store oxygen in order to help prevent excessive transfer of oxygen to the magnetic tunnel junction structure MTJ. In an implementation, the oxide layer 134 may help prevent an increase in resistance of the memory element ME. In an implementation, it may be possible to restrict migration of oxygen to the magnetic tunnel junction structure MTJ during an oxygen supply process or an annealing process in a manufacturing process of the semiconductor device 100. The oxide layer 134 may include, e.g., an oxide of Ta, TaB, or a combination thereof.

The capping layer 140 may be on the oxidation control layer 130. The capping layer 140 may help protect the oxidation control layer 130 and the magnetic tunnel junction structure MTJ. The capping layer 140 may include, e.g., Ru, Ta, Al, Cu, Au, Ag, Ti, TaN, or TiN. In an implementation, the capping layer 140 may include Ru.

The upper electrode 150 may be on the capping layer 140. The upper electrode 150 may be electrically connected to the lower electrode 110 via the magnetic tunnel junction structure MTJ. The upper electrode 150 may include a conductive material. In an implementation, the upper electrode 150 may include a metal, e.g., W, Ti, Ta, or the like, or a metal nitride, e.g., WN, TiN, TaN, or the like. In an implementation, the upper electrode 150 may include TiN.

The passivation layer 160 may cover surfaces of the lower interlayer insulating layer ILD1 and the memory element ME. In an implementation, the passivation layer 160 may cover a portion of an upper surface of the lower interlayer insulating layer ILD1 while covering a side surface of the memory element ME. The passivation layer 160 may include, e.g., silicon nitride, silicon oxynitride, or a combination thereof.

The semiconductor device 100 may further include an upper interlayer insulating layer ILD2. The upper interlayer insulating layer ILD2 may cover the passivation layer 160. An upper surface of the upper interlayer insulating layer ILD2 may be coplanar with an upper surface of the upper electrode 150. The upper interlayer insulating layer ILD2 may include, e.g., silicon oxide, silicon nitride, silicon oxynitride, or a combination thereof. In an implementation, the upper interlayer insulating layer ILD2 may include silicon oxide.

The upper wiring layer 170 may cover the upper electrode 150, the passivation layer 160, and the upper interlayer insulating layer ILD2. The upper wiring layer 170 may be electrically connected to the contact plug CP via the memory element ME. The upper electrode 150 may extend in a horizontal direction, and may include Cu.

Figure 4:
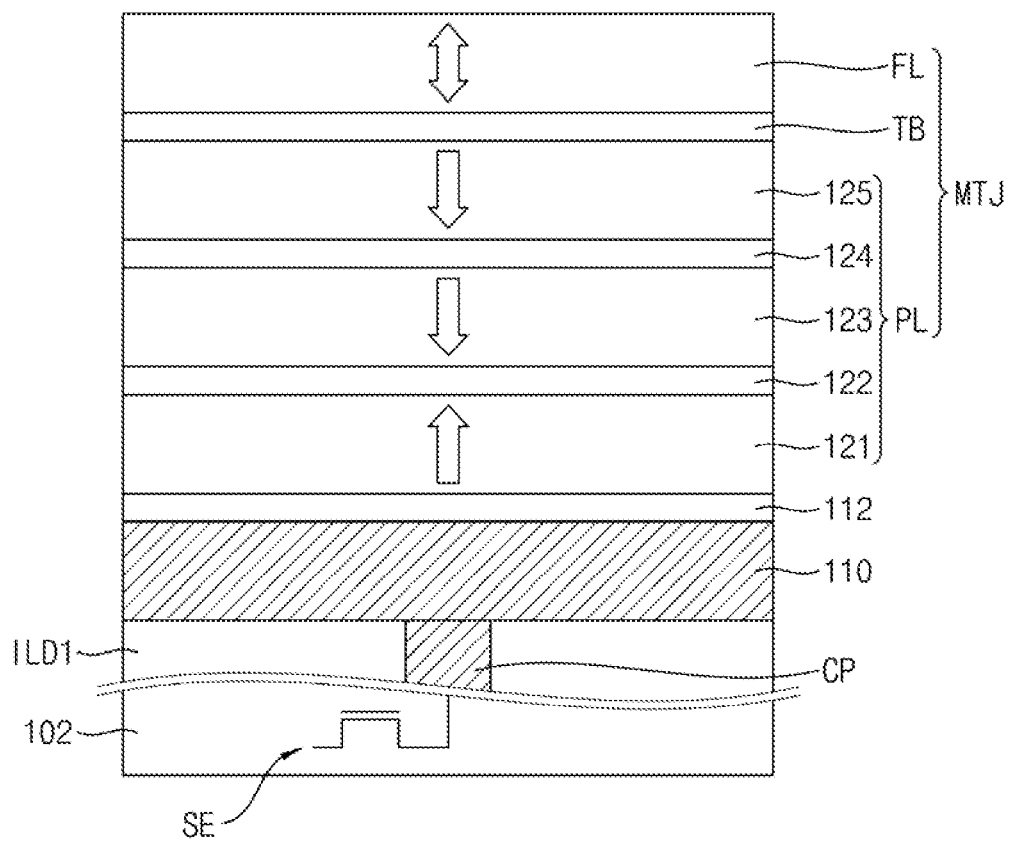
FIGS. 4 to 6 are cross-sectional views of stages in a method of manufacturing a semiconductor device according to an example embodiment.
Figure 5:
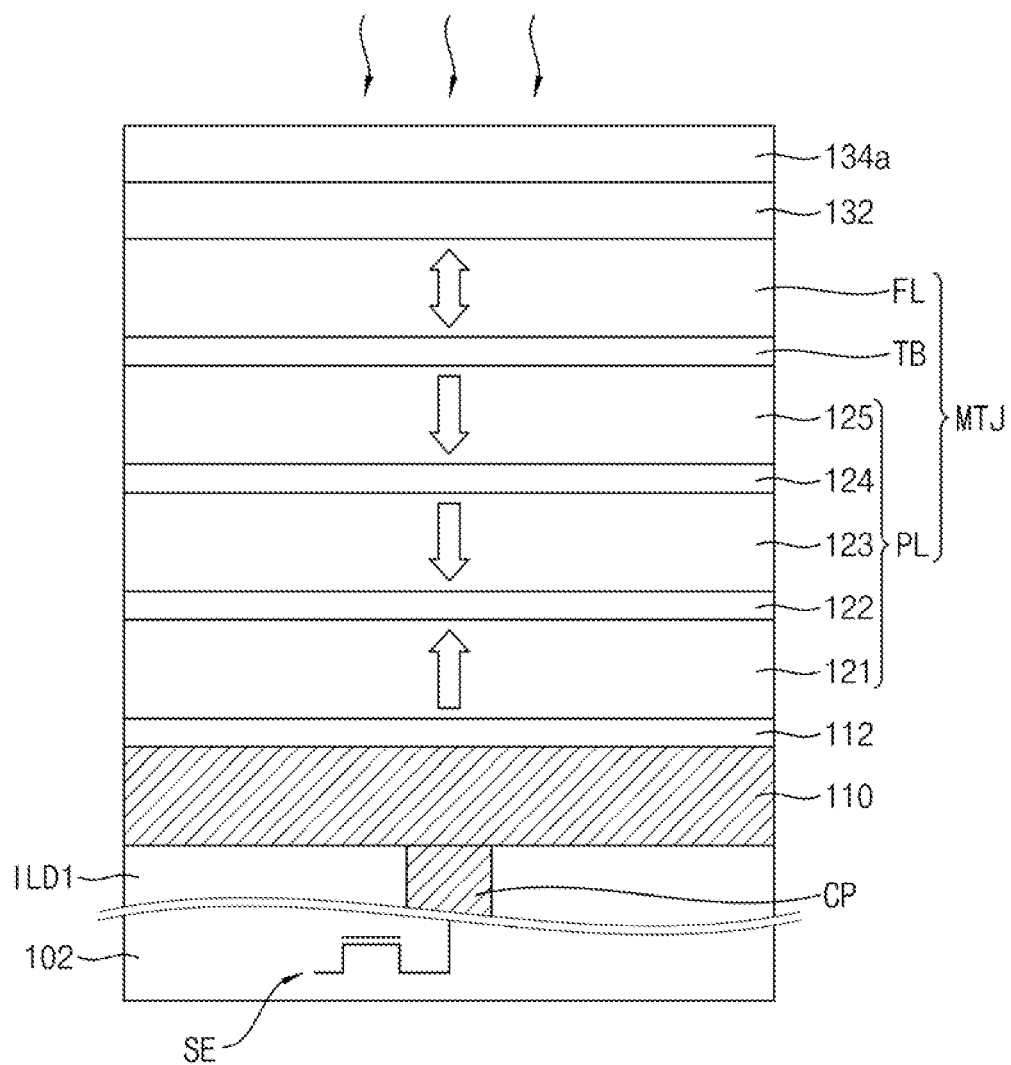
Figure 6:
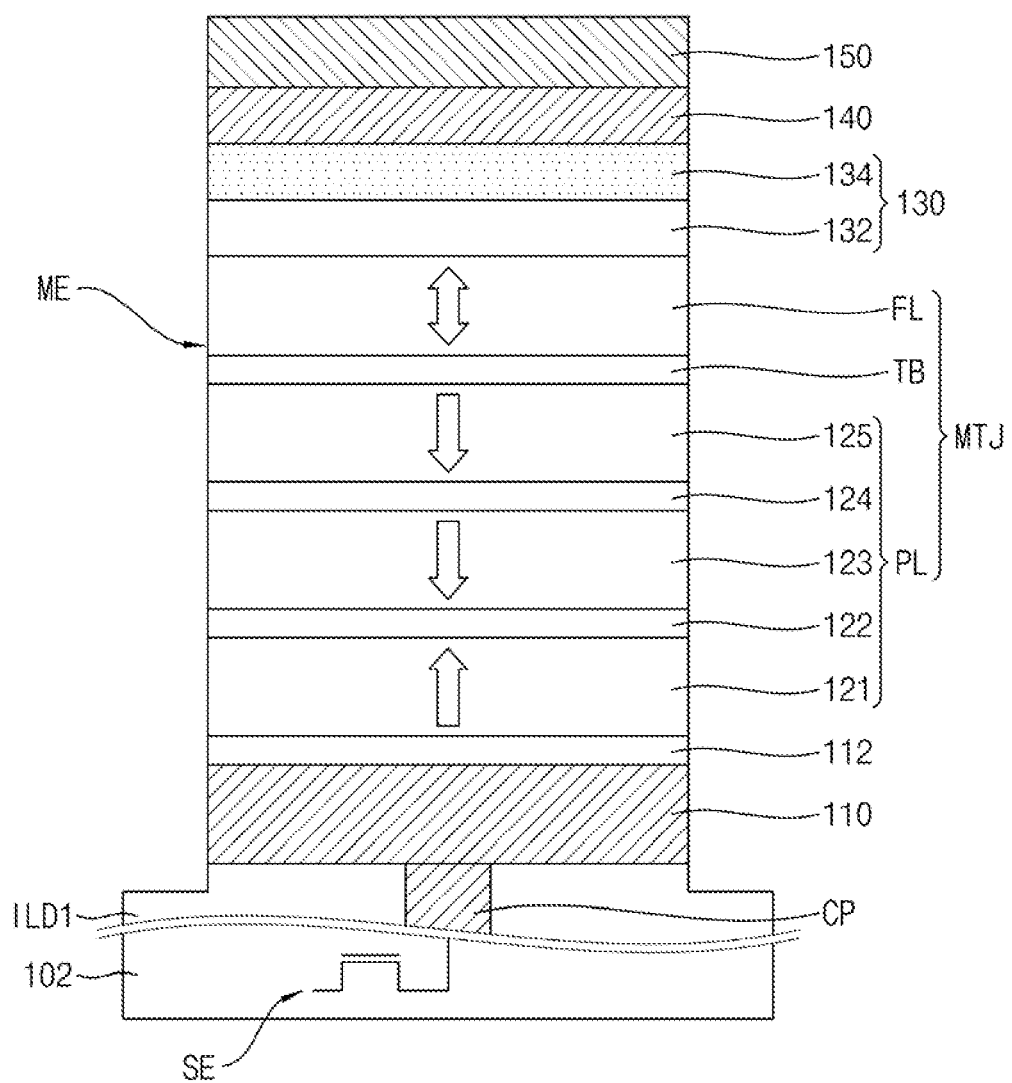

FIGS. 4 to 6 are cross-sectional views of stages in a method of manufacturing a semiconductor device according to an example embodiment.

Referring to FIG. 4, a lower interlayer insulating layer ILD1 and a contact plug CP may be formed on a substrate 102. Formation of the contact plug CP may include etching the lower interlayer insulating layer ILD1, thereby forming an opening, filling the opening with a conductive material, and performing a planarization process such that the conductive material becomes coplanar with the lower interlayer insulating layer ILD1. The contact plug CP may be electrically connected to a selection element SE.

A lower electrode 110, a seed layer 112, a first magnetic layer 121, a first spacer 122, a second magnetic layer 123, a second spacer 124, a polarization enhancement layer 125, a tunnel barrier layer TB, and a free layer FL may be sequentially stacked on upper surfaces of the lower interlayer insulating layer ILD1 and the contact plug CP. In an implementation, the stacking process may include a stoppering process, and may be performed in an in-situ manner.

Referring to FIG. 5, a filter layer 132 and a preliminary oxide layer 134a may be sequentially stacked. The stacking process may include a sputtering process. The filter layer 132 may include an alloy of a metal material having high oxygen affinity and a ferromagnetic material. In an implementation, the filter layer 132 may include, e.g., MoCoFe. The preliminary oxide layer 134a may include a metal or an alloy. In an implementation, the preliminary oxide layer 134a may include Ta, TaB, or a combination thereof.

After formation of the filter layer 132 and the preliminary oxide layer 134a, an oxidation process for or on the preliminary oxide layer 134a may be performed. The oxidation process may include a process of supplying oxygen at a temperature of 300° C. or more. Through the oxidation process, the preliminary oxide layer 134a may receive oxygen and, as such, may be oxidized. In the oxidation process, the filter layer 132 may help control oxygen diffusion from the oxide layer 134 to the free layer FL, but may not completely prevent oxygen diffusion. In an implementation, oxygen may be supplied to an interface between the free layer FL and the filter layer 132 by or through the filter layer 132, and interface perpendicular magnetic anisotropy may be formed at the interface between the free layer FL and the filter layer 132 in accordance with iron-nitrogen coupling. In an implementation, the filter layer 132 may help control an amount of oxygen supplied to the interface in order to achieve sufficient formation of interface perpendicular magnetic anisotropy.

Referring to FIG. 6, the preliminary oxide may be oxidized in accordance with the oxidation process and, as such, an oxide layer 134 may be formed. A capping layer 140 and an upper electrode 150 may be formed on the oxide layer 134. Formation of the capping layer 140 and the upper electrode 150 may include sequentially stacking a capping material and a conductive mask layer on the oxide layer 134, and then performing an etching process using the conductive mask layer as an etch mask. The etching process may include a reactive ion etching (RIE) process, an ion beam etching (IBE) process, or an Ar milling process. As the capping material and the conductive mask layer are etched through the etching process, the capping layer 140 and the upper electrode 150 may be formed. In an implementation, the lower electrode 110, the seed layer 112, the magnetic tunnel junction structure MTJ and the oxidation control layer 130 may be etched by the etching process. The lower electrode 110, the seed layer 112, the magnetic tunnel junction structure MTJ, the oxidation control layer 130, the capping layer 140 and the upper electrode 150 may constitute a memory element ME. The etching process may also partially etch the lower interlayer insulating layer ILD1.

Again referring to FIG. 2, a passivation layer 160, an upper interlayer insulating layer ILD2, and an upper wiring layer 170 may be formed. Formation of the passivation layer 160 and the upper interlayer insulating layer ILD2 may include conformally depositing an insulating material on the resultant structure of FIG. 6, forming an interlayer insulating material on the insulating material, and performing a planarization process.

FIGS. 7 to 10 are cross-sectional views of semiconductor devices according to example embodiments.

Figure 7:
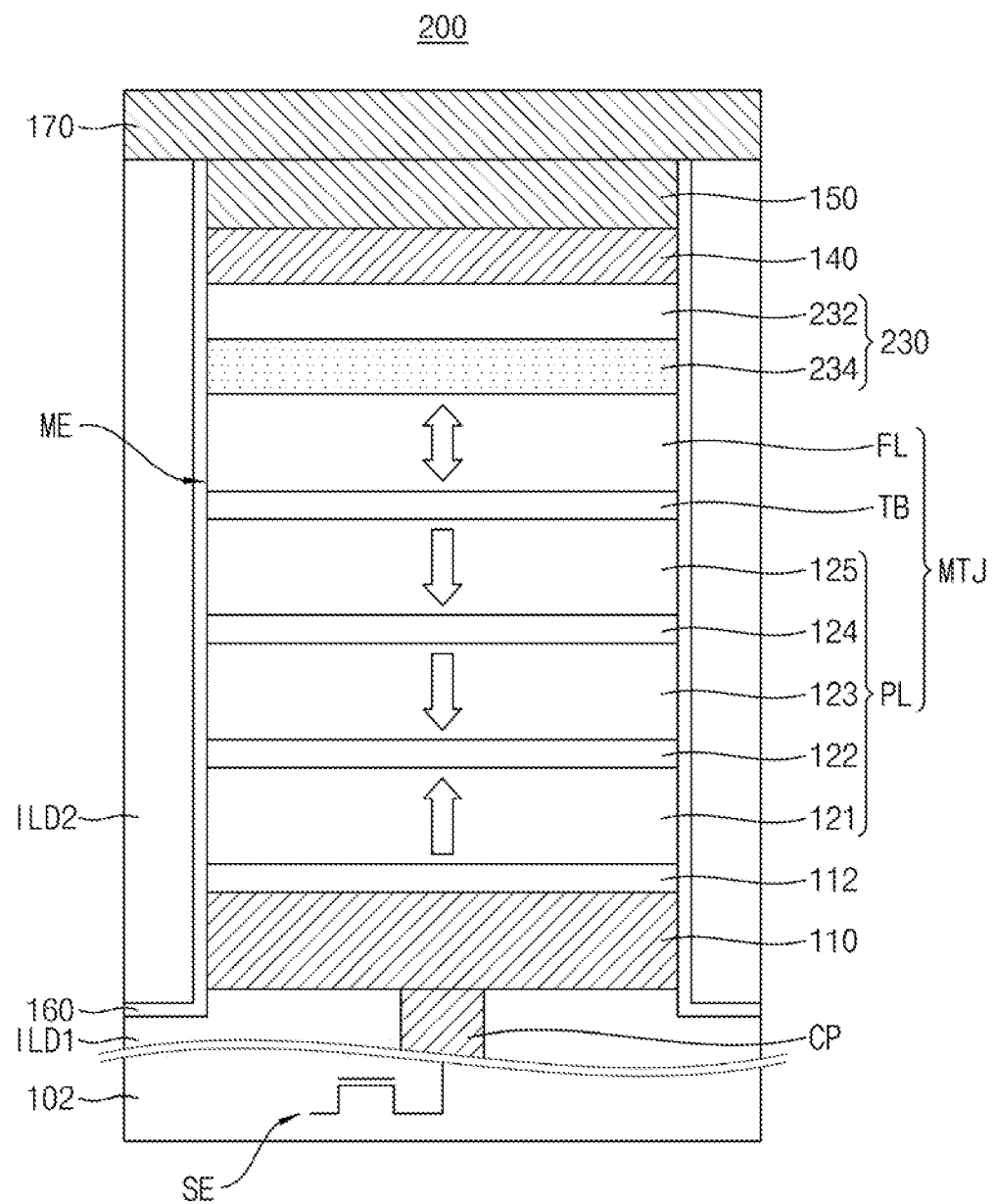
FIGS. 7 to 10 are cross-sectional views of semiconductor devices according to example embodiments.

Referring to FIG. 7, a memory element ME of a semiconductor device 200 may include an oxidation control layer 230 between a free layer FL and a capping layer 140. The oxidation control layer 230 may include a filter layer 232 and an oxide layer 234. In an implementation, the filter layer 232 may be on the oxide layer 234, and the oxide layer 234 may contact (e.g., directly contact) an upper surface of the free layer FL. The filter layer 232 may help limit an amount of oxygen supplied to the oxide layer 234 and the free layer FL during an oxidation process and a BEOL process.

Figure 8:
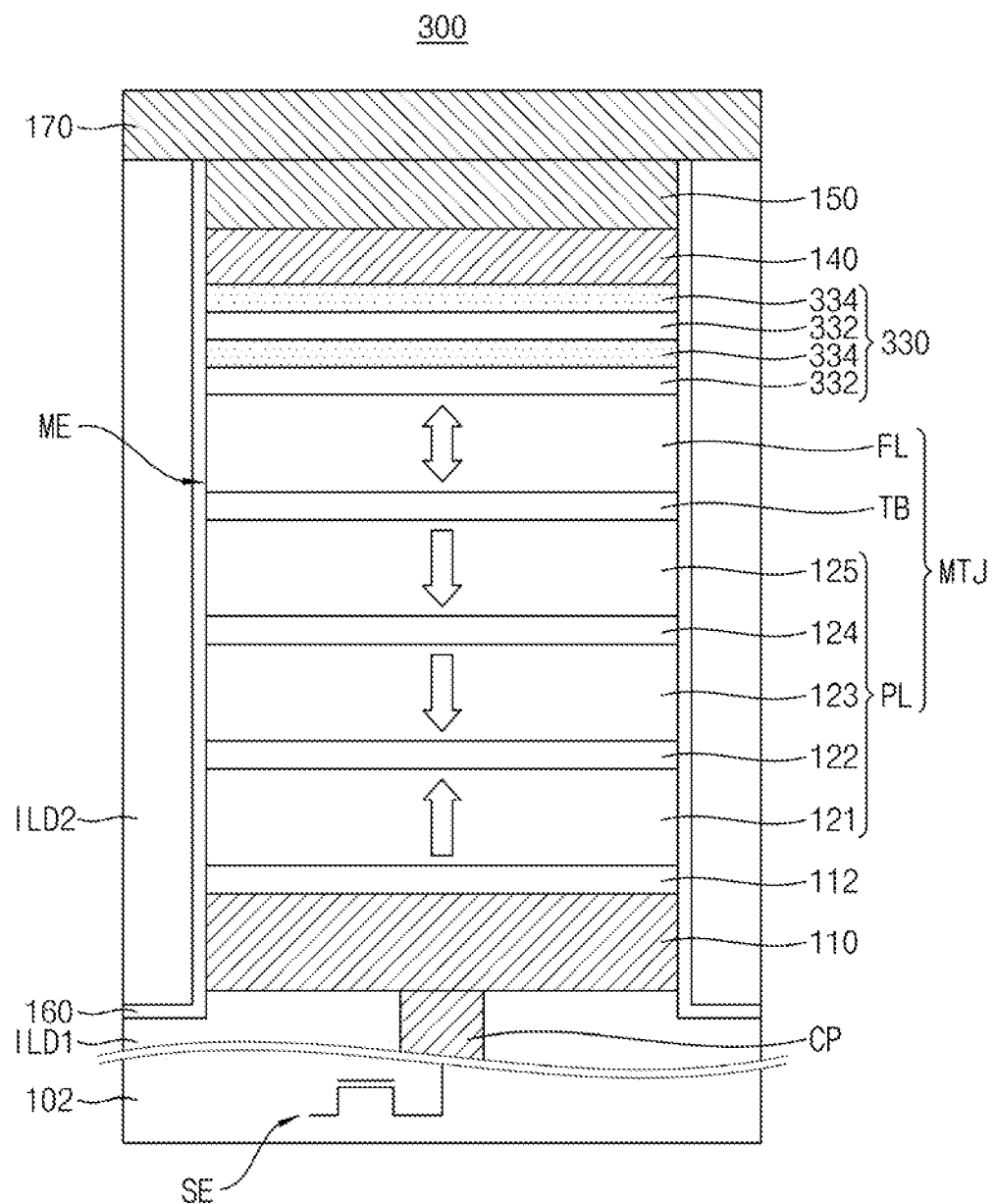

Referring to FIG. 8, a memory element ME of a semiconductor device 300 may include an oxidation control layer 330 between a magnetic tunnel junction structure MTJ and a capping layer 140. In an implementation, the oxidation control layer 330 may include a plurality of filter layers 332 and a plurality of oxide layers 334. In an implementation, as illustrated in the drawings, two filter layers 332 and two oxide layers 334 may be present. In an implementation, the semiconductor device 300 may include three or more filter layers 332 and three or more oxide layers 334. The plurality of filter layers 332 and the plurality of oxide layers 334 may be alternately stacked. In an implementation, a free layer FL may contact (e.g., directly contact) one of the plurality of filter layers 332.

Figure 9:
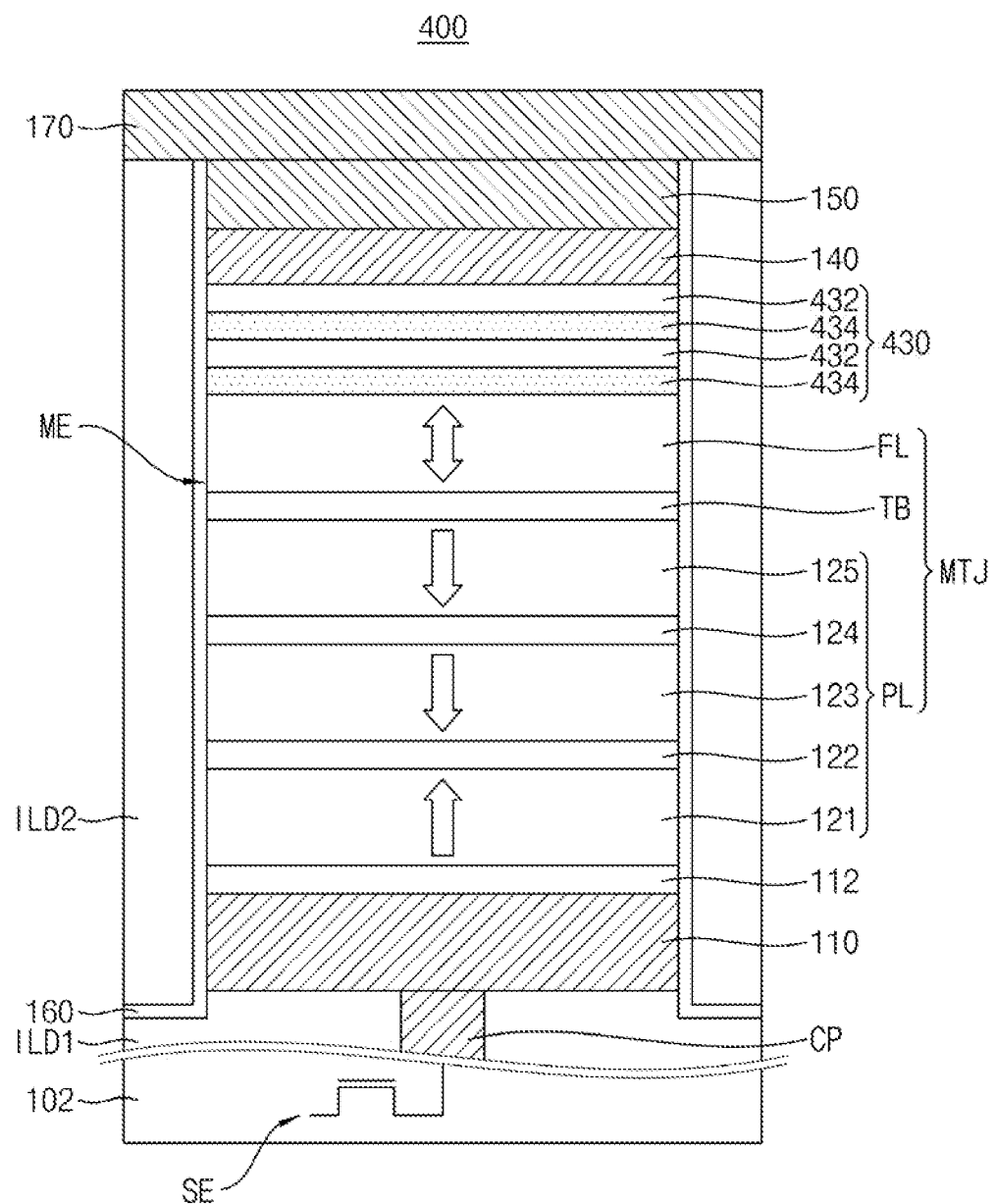

Referring to FIG. 9, a memory element ME of a semiconductor device 400 may include an oxidation control layer 430 between a magnetic tunnel junction structure MTJ and a capping layer 140. In an implementation, the oxidation control layer 430 may include a plurality of filter layers 432 and a plurality of oxide layers 434 which are alternately stacked. In an implementation, a free layer FL may contact (e.g., directly contact) one of the plurality of oxide layers 434.

Figure 10:
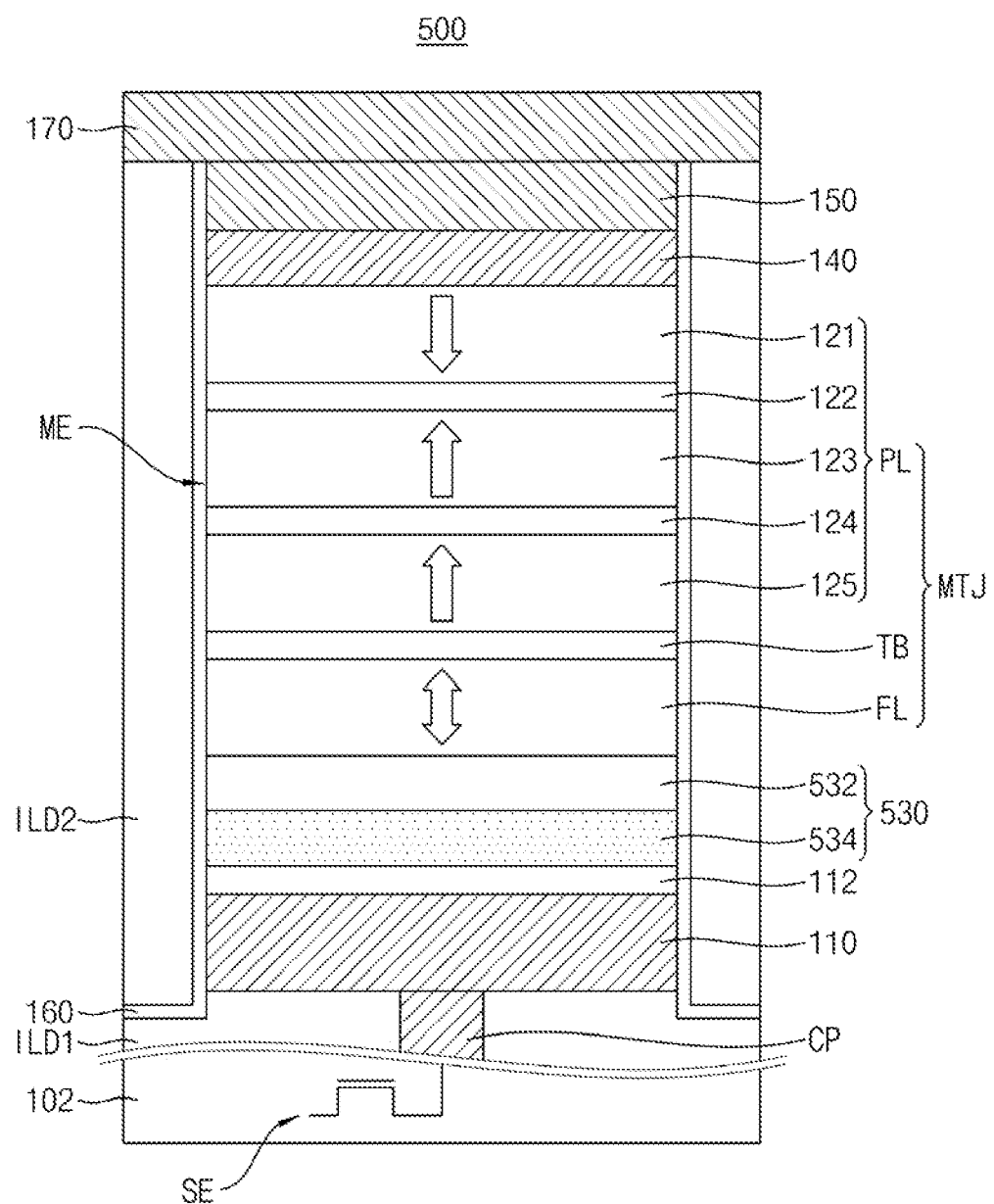

Referring to FIG. 10, a memory element ME of a semiconductor device 500 may include an oxidation control layer 530, a magnetic tunnel junction structure MTJ, and a capping layer 140 which are sequentially stacked in this order. The magnetic tunnel junction structure MTJ may have a structure in which a free layer FL is below a pinned structure PL (e.g., between the pinned structure PL and the substrate 102). In an implementation, the magnetic tunnel junction structure MTJ may include a free layer FL, a tunnel barrier layer TB, and a pinned layer PL which are sequentially stacked in this order. The pinned layer PL may include a polarization enhancement layer 125, a second spacer 124, a second magnetic layer 123, a first spacer 122 and a first magnetic layer 121 which are sequentially stacked in this order. The pinned layer PL may be between the tunnel barrier layer TB and the capping layer 140. In an implementation, the first magnetic layer 121 of the pinned layer PL may contact (e.g., directly contact) the capping layer 140.

The oxidation control layer 530 may be between the free layer FL and a seed layer 112, and may include a filter layer 532 and an oxide layer 534. In an implementation, the filter layer 532 may be on the oxide layer 534, and may contact (e.g., directly contact) the free layer FL. The oxide layer 534 may contact (e.g., directly contact) the seed layer 112.

Referring to FIG. 10, formation of the oxidation control layer 530 may include forming a preliminary oxide layer and a filter layer 532 on the seed layer 112, and supplying oxygen in order to oxidize the preliminary oxide layer. In an implementation, the oxygen supply process may be performed after formation of the filter layer 532. In an implementation, the oxygen supply process may be performed before formation of the preliminary oxide layer. In an implementation, the oxygen supply process may be performed before formation of the preliminary oxide layer and formation of the filter layer 532.

Figure 11:
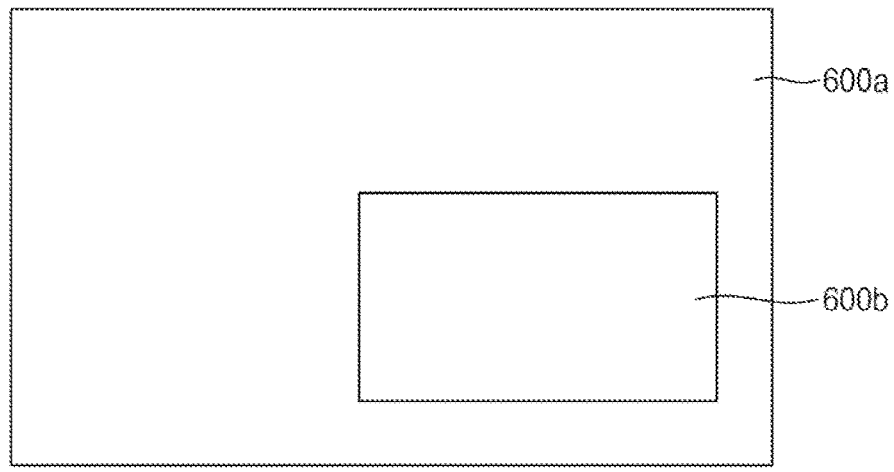
FIG. 11 is a conceptual view of a semiconductor device including a logic area and a memory area according to an example embodiment.
Figure 12:
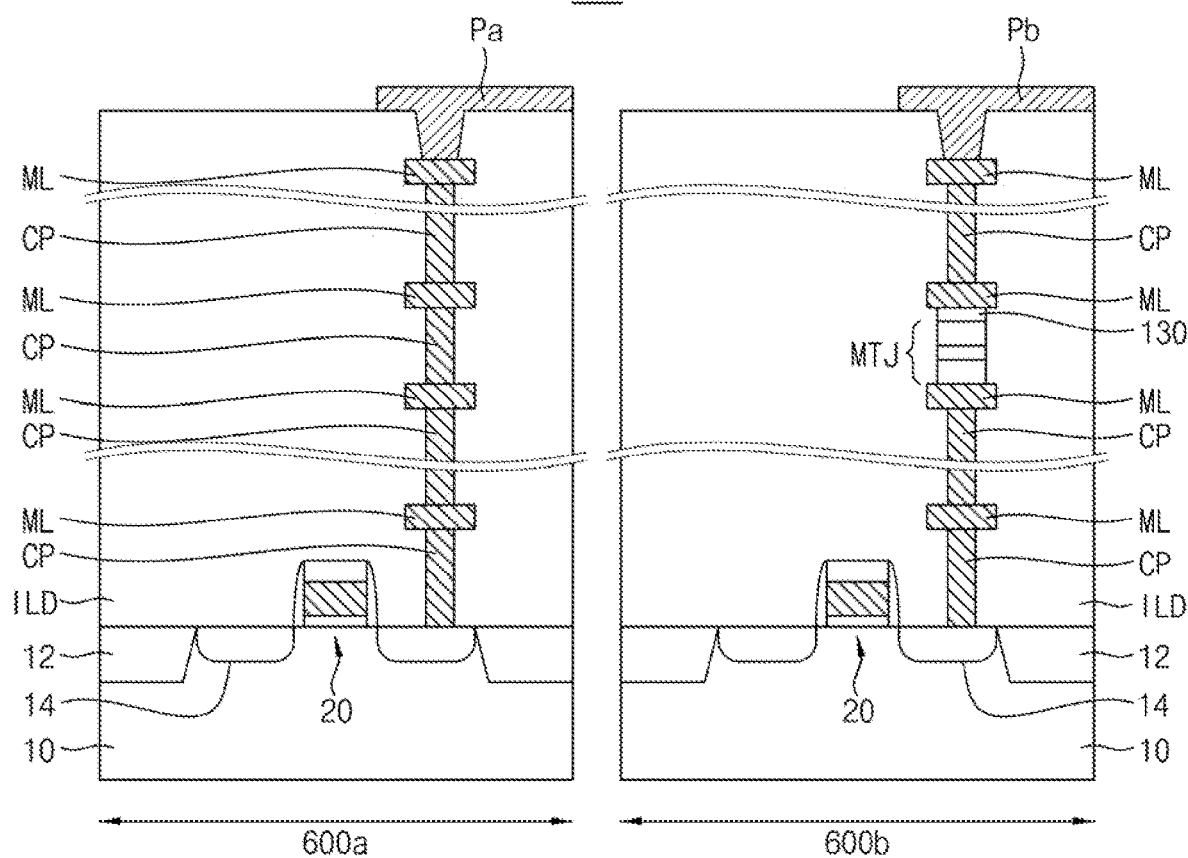
FIG. 12 is a cross-sectional view of the semiconductor device shown in FIG. 11.

FIG. 11 is a conceptual view of a semiconductor device including a logic area and a memory area according to an example embodiment. FIG. 12 is a cross-sectional view of the semiconductor device shown in FIG. 11.

Referring to FIG. 11, a semiconductor device 600 may include a logic area 600a and a memory area 600b. A plurality of logic elements may be in or on the logic area 600a, and the logic elements may constitute various circuits. A memory element may be in or on the memory area 600b, and the memory element may be formed at the semiconductor device 600 in an embedded form. In an implementation, the logic elements of the logic area 600a and the memory element of the memory area 600b may be simultaneously formed in formation of the semiconductor device 600. In an implementation, as illustrated in the drawings, the memory area 600b may have a quadrangular shape. In an implementation, the memory area 600b may have various suitable structures, e.g., a circular shape, an oval shape, a polygonal shape other than a quadrangular shape, or the like.

Referring to FIG. 12, each of the logic area 600a and the memory area 600b may include a substrate 10, an element isolation layer 12, an impurity region 14, and a transistor 20. The substrate 10, the element isolation layer 12, the impurity region 14 and the transistor 20 of the memory area 600b may be formed simultaneously with the substrate 10, the element isolation layer 12, the impurity region 14 and the transistor 20 of the logic area 600a. Each substrate 10 and each transistor 20 may correspond to the substrate 102 and the selection element SE shown in FIG. 2, respectively.

In an implementation, each of the logic area 600a and the memory area 600b may include contact plugs CP (electrically connected the impurity regions 14), wiring layers ML, and an interlayer insulating layer ILD (covering the contact plugs CP and the wiring layers ML). The contact plugs CP may electrically interconnect the wiring layers ML which are vertically spaced apart from one another. The wiring layers ML may extend (e.g., lengthwise) in a horizontal direction. The interlayer insulating layer ILD may be constituted by a single layer or multiple layers. The transistor 20, the contact plugs CP, and the wiring layers ML of the logic area 600a may constitute a logic element.

The memory area 600b may further include a magnetic tunnel junction structure MTJ and an oxidation control layer 130. The magnetic tunnel junction structure MTJ and the oxidation control layer 130 may be at the same level (e.g., vertical distance from the substrate 10) as one of the contact plugs CP of the logic area 600a. As shown in FIG. 2, the magnetic tunnel junction structure MTJ may include a free layer FL, a pinned layer PL, and a tunnel barrier layer TB. The magnetic tunnel junction structure MTJ may be electrically connected to the corresponding impurity region 14. The oxidation control layer 130 may be between the free layer FL and the wiring layer ML. In an implementation, when the free layer FL is at an upper portion of the magnetic tunnel junction structure MTJ (e.g., distal to the substrate 10), the oxidation control layer 130 may be on the magnetic tunnel junction structure MTJ. In an implementation, when the free layer FL is at a lower portion of the magnetic tunnel junction structure MTJ (e.g., proximate to the substrate 10), the oxidation control layer 130 may be under the magnetic tunnel junction structure MTJ. The magnetic tunnel junction structure MTJ and the oxidation control layer 130 may constitute a memory element, and the memory element may further include the lower electrode 110, the seed layer 112, the capping layer 140, and the upper electrode 150, which are shown in FIG. 2. The upper wiring layer 170 of FIG. 2 may correspond to one of the wiring layers ML.

The logic area 600a and the memory area 600b may further include an input/output terminal Pa and an input/output terminal Pb on the interlayer insulating layer ILD, respectively. The input/output terminals Pa and Pb may contact corresponding ones of the wiring layers ML. The input/output terminal Pb of the memory area 600b may be electrically connected to the magnetic tunnel junction structure MTJ.

In accordance with the exemplary embodiments of the disclosure, an oxidation control layer may help reduce or prevent degradation of a memory device and, as such, may reduce resistance of a semiconductor device.

One or more embodiments may provide a semiconductor device having an oxidation control layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a substrate;
    a lower electrode on the substrate;
    a magnetic tunnel junction structure on the lower electrode, the magnetic tunnel junction structure including a pinned layer, a tunnel barrier layer, and a free layer which are sequentially stacked;
    an upper electrode on the magnetic tunnel junction structure; and
    an oxidation control layer between the free layer and the upper electrode, the oxidation control layer including at least one filter layer and at least one oxide layer,
    wherein the at least one filter layer includes MoCoFe.

2. The semiconductor device as claimed in claim 1, wherein:
    the free layer contacts the at least one filter layer, and
    the at least one oxide layer is on the at least one filter layer.

3. The semiconductor device as claimed in claim 1, wherein:
    the free layer contacts the at least one oxide layer, and
    the at least one filter layer is on the at least one oxide layer.

4. The semiconductor device as claimed in claim 1, wherein:
    the oxidation control layer includes a plurality of the filter layers and a plurality of the oxide layers which are alternately stacked; and
    the free layer contacts one filter layer of the plurality of filter layers.

5. The semiconductor device as claimed in claim 1, wherein:
    the oxidation control layer includes a plurality of the filter layers and a plurality of the oxide layers which are alternately stacked; and
    the free layer contacts one oxide layer of the plurality of oxide layers.

6. The semiconductor device as claimed in claim 1, wherein the at least one oxide layer includes an oxide of Ta, TaB, or a combination thereof.

7. The semiconductor device as claimed in claim 1, wherein the at least one filter layer is configured to control diffusion of oxygen transferred to the free layer.

8. The semiconductor device as claimed in claim 1, wherein a thickness of the oxidation control layer is 3 Å to 20 Å.

9. The semiconductor device as claimed in claim 1, wherein the at least one filter layer has a grain structure.

10. The semiconductor device as claimed in claim 1, wherein the pinned layer includes a first magnetic layer, a first spacer, a second magnetic layer, a second spacer, and a polarization enhancement layer which are sequentially stacked.

11. The semiconductor device as claimed in claim 10, wherein the first magnetic layer, the second magnetic layer, and the polarization enhancement layer each independently include CoFe or CoFeB.

12. The semiconductor device as claimed in claim 1, further comprising;
a seed layer between the lower electrode and the pinned layer; and
a capping layer between the oxidation control layer and the upper electrode.

13. The semiconductor device as claimed in claim 1, further comprising:
a passivation layer covering side surfaces of the magnetic tunnel junction structure and the oxidation control layer; and
an interlayer insulating layer covering the passivation layer.

14. A semiconductor device, comprising:
a substrate;
a lower electrode on the substrate;
a magnetic tunnel junction structure on the lower electrode, the magnetic tunnel junction structure including a free layer, a tunnel barrier layer, and a pinned layer which are sequentially stacked;
an upper electrode on the magnetic tunnel junction structure; and
an oxidation control layer between the free layer and the lower electrode, the oxidation control layer including a filter layer and an oxide layer,
wherein the filter layer includes MoCoFe.

15. The semiconductor device as claimed in claim 14, wherein:
the free layer contacts the filter layer, and
the oxide layer is under the filter layer.

16. The semiconductor device as claimed in claim 14, wherein the pinned layer includes a polarization enhancement layer, a second spacer, a second magnetic layer, a first spacer, and a first magnetic layer which are sequentially stacked.

17. The semiconductor device as claimed in claim 16, wherein the oxide layer includes an oxide of Ta, TaB, or a combination thereof.

18. A semiconductor device, comprising:
a substrate including a logic area including a logic element, and a memory area including a memory element disposed in the logic area in an embedded form; and
transistors on the substrate,
wherein:
the memory element includes:
a lower electrode,
a magnetic tunnel junction structure on the lower electrode, the magnetic tunnel junction structure including a pinned layer, a free layer, and a tunnel barrier layer between the pinned layer and the free layer,
an upper electrode on the magnetic tunnel junction structure, and
an oxidation control layer between the free layer and the upper electrode or between the free layer and the lower electrode, the oxidation control layer including a filter layer and an oxide layer, and
the filter layer includes MoCoFe.

19. The semiconductor device as claimed in claim 18, wherein each of the logic area and the memory area includes wiring layers electrically connected to the transistors and contact plugs connecting the wiring layers.

20. The semiconductor device as claimed in claim 19, wherein the memory element is at a same level as one of the contact plugs in the logic area.

* * * * *